(12) United States Patent
Seurin et al.

(10) Patent No.: US 11,916,355 B2
(45) Date of Patent: Feb. 27, 2024

(54) NARROW BEAM DIVERGENCE SEMICONDUCTOR SOURCES

(71) Applicant: Princeton Optronics, Inc., Mercerville, NJ (US)

(72) Inventors: Jean-Francois Seurin, Eindhoven (NL); Robert Van Leeuwen, Eindhoven (NL); Chuni Ghosh, Eindhoven (NL)

(73) Assignee: Princeton Optronics, Inc., Mercerville, NJ (US)

( * ) Notice: Subject to any disclaimer, the term of this patent is extended or adjusted under 35 U.S.C. 154(b) by 599 days.

(21) Appl. No.: 16/957,856

(22) PCT Filed: Dec. 26, 2018

(86) PCT No.: PCT/US2018/067533
§ 371 (c)(1),
(2) Date: Jun. 25, 2020

(87) PCT Pub. No.: WO2019/133630
PCT Pub. Date: Jul. 4, 2019

(65) Prior Publication Data
US 2021/0057883 A1 Feb. 25, 2021

Related U.S. Application Data

(60) Provisional application No. 62/611,171, filed on Dec. 28, 2017.

(51) Int. Cl.
*H01S 5/183* (2006.01)
(52) U.S. Cl.
CPC ...... *H01S 5/18369* (2013.01); *H01S 5/18313* (2013.01); *H01S 5/18377* (2013.01); *H01S 2301/163* (2013.01)

(58) Field of Classification Search
CPC ............. H01S 5/18369; H01S 5/18313; H01S 5/18377; H01S 2301/163
See application file for complete search history.

(56) References Cited

U.S. PATENT DOCUMENTS 6,549,556 B1 * 4/2003 Hwang ............... H01S 5/18341
372/96
6,618,414 B1 9/2003 Wasserbauer et al.
(Continued)

FOREIGN PATENT DOCUMENTS

| CN | 1266204 A | 9/2000 |
| CN | 1741333 A | 3/2006 |

(Continued)

OTHER PUBLICATIONS

Extended Search Report issued from the European Patent Office for related Application No. EP18897638.5 dated Sep. 9, 2021 (12 Pages).
P.A. Morgan et al., "Hybrid dielectric/AlGaAs mirror spatially filtered vertical cavity top-surface emitting laser", Applied Physics Letters, A I P Publishing LLC, US, vol. 66, No. 10, Mar. 6, 1995, pp. 1157-1159.
(Continued)

*Primary Examiner* — Yuanda Zhang
(74) *Attorney, Agent, or Firm* — Michael Best & Friedrich LLP

(57) ABSTRACT

Narrow beam divergence semiconductor sources are operable to generate a beam having a substantially narrow beam divergence, an emission wavelength, and a substantially uniform beam intensity. The presence of an extended length mirror can help suppress one or more longitudinal and/or transverse modes such that the beam divergence and/or the spectral width of emission is substantially reduced.

19 Claims, 4 Drawing Sheets

(56) References Cited

U.S. PATENT DOCUMENTS

| | | | |
|---|---|---|---|
| 2005/0074045 A1 | 4/2005 | Wu et al. | |
| 2005/0100063 A1 | 5/2005 | Wasserbauer et al. | |
| 2005/0243890 A1* | 11/2005 | Kim | B82Y 20/00 |
| | | | 372/98 |
| 2007/0258501 A1* | 11/2007 | Chirovsky | H01S 5/18341 |
| | | | 372/50.11 |
| 2015/0078410 A1 | 3/2015 | Padullaparthi | |
| 2017/0214218 A1 | 7/2017 | Tan et al. | |

FOREIGN PATENT DOCUMENTS

| | | |
|---|---|---|
| CN | 103887705 A | 6/2014 |
| DE | 10244447 A1 | 4/2004 |
| EP | 0803945 A2 | 10/1997 |
| TW | 201004076 A | 1/2010 |
| TW | 201507303 A | 2/2015 |
| WO | 2009081328 A1 | 7/2009 |
| WO | 2014065259 A1 | 5/2014 |

OTHER PUBLICATIONS

Houdre R., et al. "INGAAS/GAAS Vertical Cavity Surface Emitting Laser With Hybrid Top Mirror", Microelectronic Engineering, Elsevier Publishers BV., Amsterdam, NL, vol. 18, No. 3, Aug. 1, 1992, pp. 267-272.

Hammer, J. M. et al., "Single-Wavelenght Operation of the Hybrid-External Bragg-Reflector Waveguide Laser Under Dynamic Conditions", Applied Physics Letters, A I P Publishing LLC, US, vol. 47, No. 3, Aug. 1, 1985, pp. 183-185.

International Preliminary Report on Patentability for related Application No. PCT/US2018/067533 dated Jul. 9, 2020 (10 Pages).

International Search Report with Written Opinion for related Application No. PCT/US2018/067533 dated Apr. 24, 2019 (12 Pages).

Taiwanese Patent Office Action for Application No. 107147529 dated Nov. 16, 2022 (9 pages including English summarized translation).

Chinese Patent Office Action for Application No. 201880090265.1 dated Aug. 30, 2023 (17 pages including English translation).

* cited by examiner

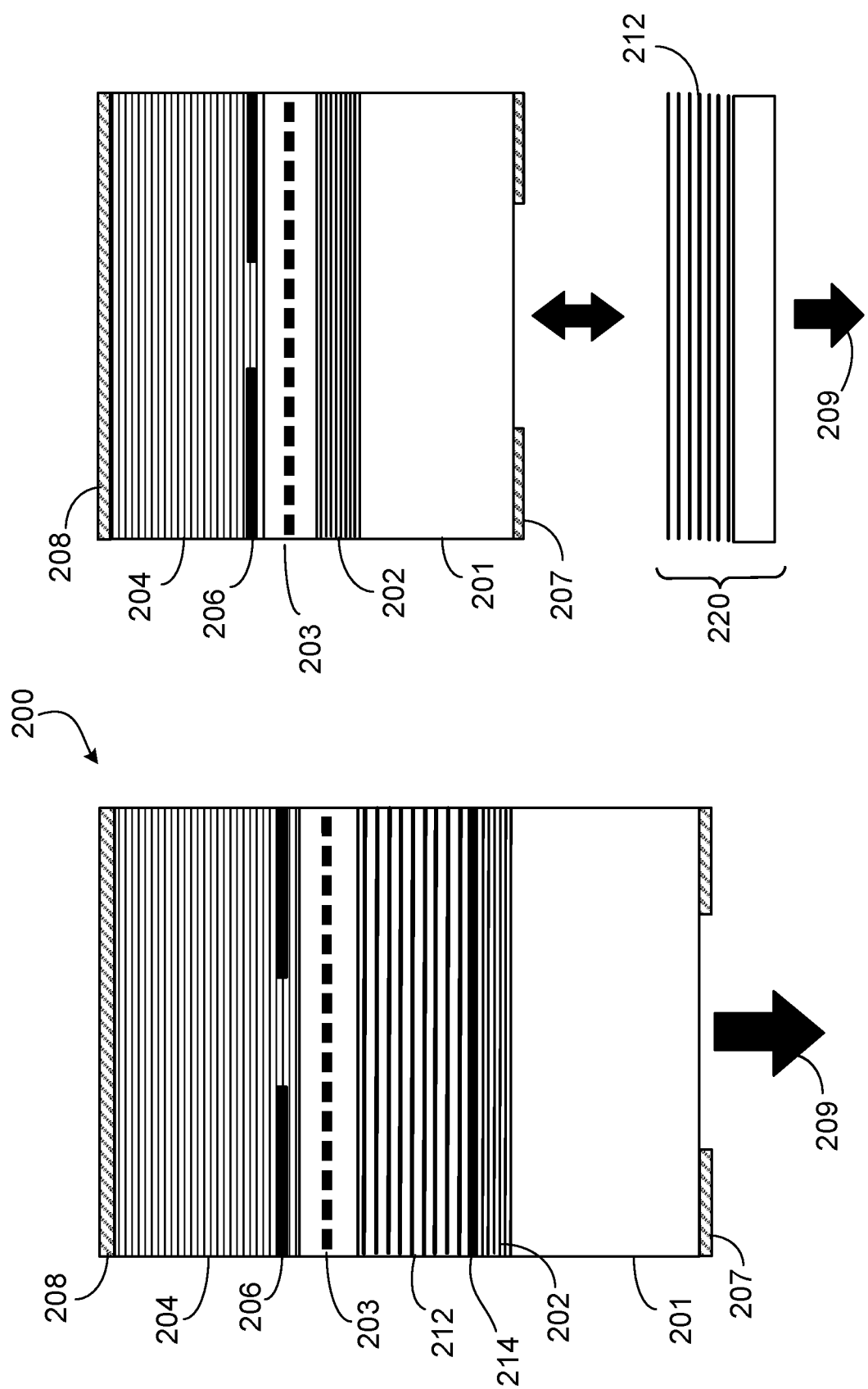

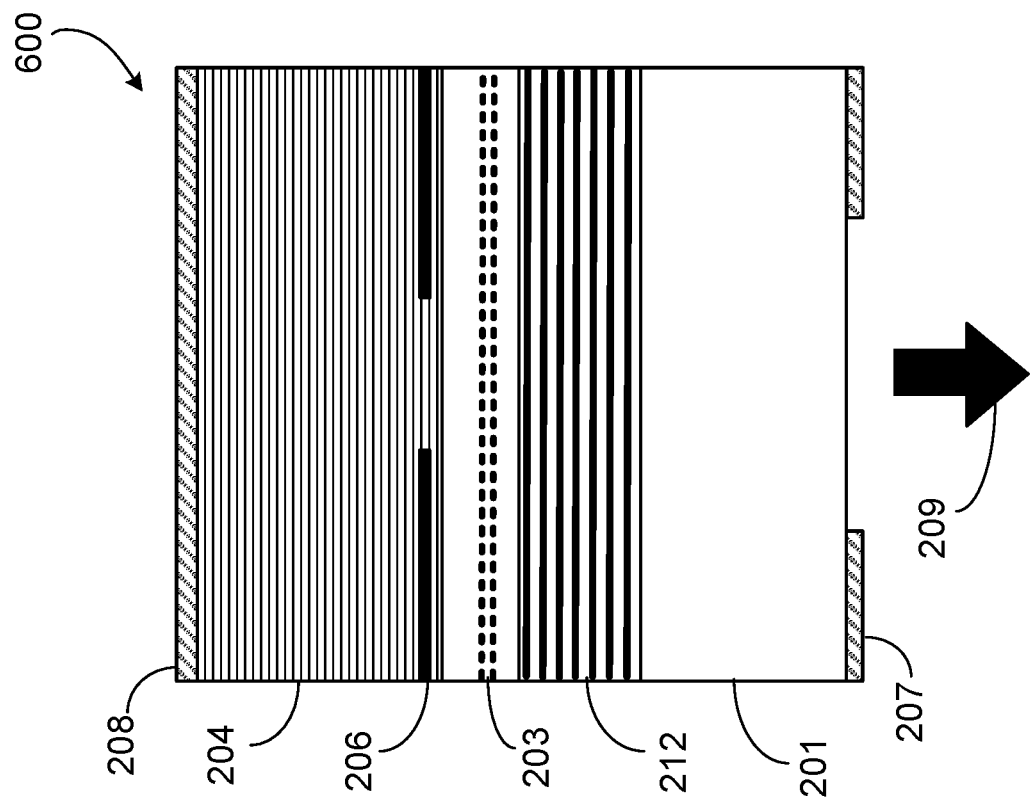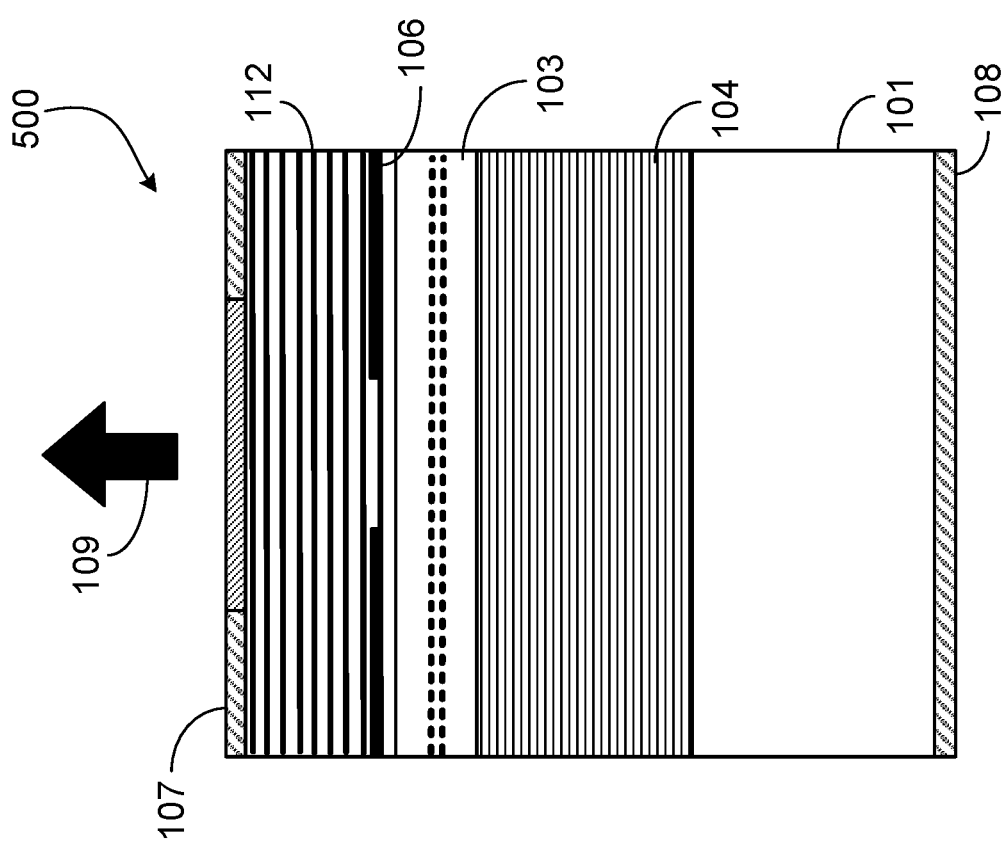

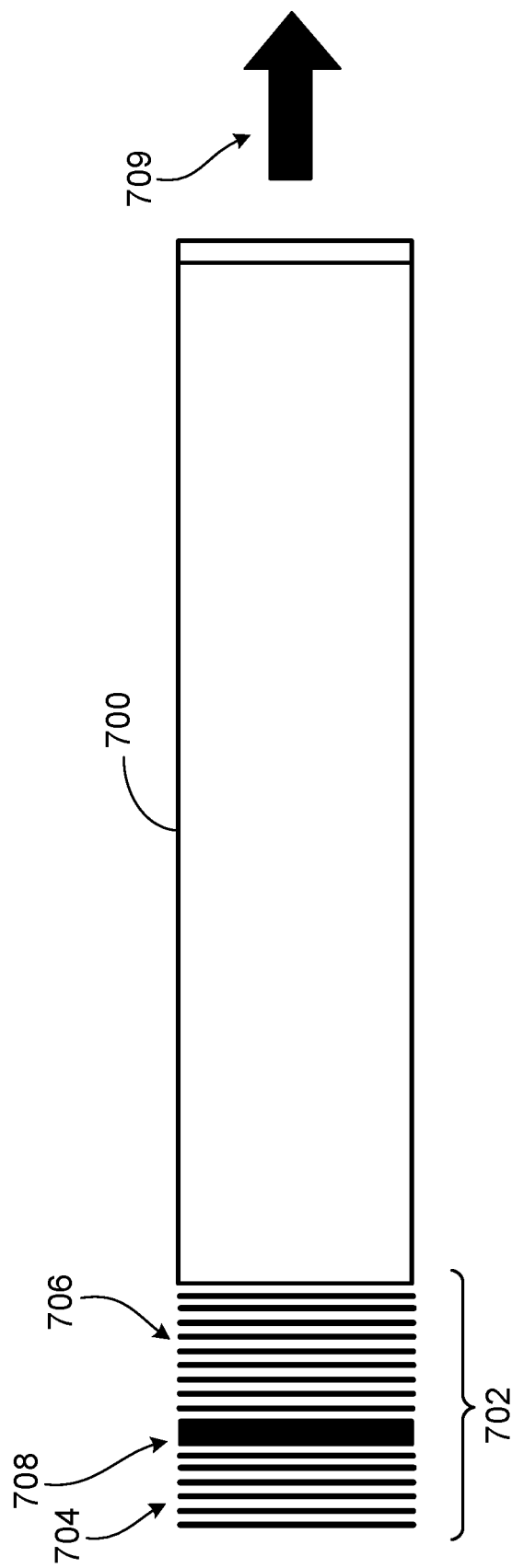

NARROW BEAM DIVERGENCE SEMICONDUCTOR SOURCES

CROSS-REFERENCE TO RELATED APPLICATION(S)

The present application is the U.S. national stage entry, under 35 U.S.C. § 371, of International Application No. PCT/US2018/067533, filed Dec. 26, 2018, which claims the benefit of priority of U.S. Provisional Patent Application No. 62/611,171, filed on Dec. 28, 2017, the contents of which are incorporated by reference herein in their entirety.

FIELD OF THE DISCLOSURE

The present disclosure relates to narrow beam divergence semiconductor sources.

BACKGROUND

A vertical-cavity surface-emitting laser (VCSEL) is a semiconductor-based laser diode that can emit a highly efficient optical beam vertically, for example, from its top surface. In VCSELs, high reflectivity mirrors are generally required. The high reflectivity mirrors can be implemented, for example, as distributed Bragg reflectors (DBR) (e.g., quarter-wave-thick layers of alternating high and low refractive indexes), made of semiconductor or dielectric material. To achieve a high reflectivity with a reasonable number of layers, a high index contrast is provided (e.g., a high-contrast DBR). However, use of a high-contrast DBR can generate a broad stop-band and, in the case of VCSELs with a long internal monolithic cavity, this will allow multiple longitudinal modes to lase. The longitudinal modes can, in some applications, give rise to undesirable or unstable operation (e.g., "kinks" in the power versus current curve; mode-hoping).

SUMMARY

The present disclosure describes narrow beam divergence semiconductor sources. The presence of an extended length mirror (also referred to sometimes as a hybrid mirror) can help suppress one or more longitudinal and/or transverse modes such that the beam divergence and/or the spectral width of emission is substantially reduced.

For example, in one aspect, the disclosure describes a narrow beam divergence semiconductor source operable to generate a beam having a substantially narrow beam divergence, an emission wavelength, and a substantially uniform beam intensity. The narrow beam divergence semiconductor source includes an optical resonant cavity including a high reflection mirror having first and second sides, an extended length mirror having first and second sides, and an active region. The high reflection mirror and the extended length mirror are disposed on distal sides of the active region such that the first side of the high reflection mirror is coupled to a first side of the active region and the first side of the extended length mirror is coupled to a second side of the active region opposing the first. Electrical contacts are operable to direct electric current to the active region.

Some implementations include one or more of the following features. For example, the extended length mirror and the high reflection mirror can be operable to suppress one or more longitudinal and/or transverse modes. In some implementations, only one longitudinal mode lases.

The disclosed techniques can be applied to various types of narrow beam divergence semiconductor sources including, for example, VCSELs, VECSELs, LEDs and RC-LEDs.

The disclosure also describes edge-emitting light sources. For example, according to one aspect, the disclosure describes a narrow beam divergence semiconductor optical edge-emitting laser that includes a hybrid distributed Bragg reflector (hybrid DBR). The hybrid DBR has first and second sides, the edge-emitting laser being disposed on the first side of the hybrid DBR. The hybrid DBR includes a high-contrast region and a low-contrast region. The high-contrast region includes multiple high refractive index difference pairs of a DBR materials of a particular charge-carrier type, the high-contrast pairs being periodically disposed within the high-contrast region. The low-contrast region includes multiple pairs of a low refractive index difference DBR materials of the particular charge-carrier type, the low-contrast pairs being periodically disposed within the low-contrast region. The hybrid DBR and the edge-emitting laser are operable to generate an emission having a spectral width of emission and a beam divergence. The edge-emitting laser and the hybrid DBR have a narrow spectral bandwidth and are operable to substantially suppress one or more transverse and/or longitudinal modes such that the beam divergence and/or the spectral width of emission is substantially reduced.

Other aspects, features and various advantages will be readily apparent fro the following detailed description, the accompanying drawings, and the claims.

BRIEF DESCRIPTION OF THE DRAWINGS

FIG. 3 illustrates an example of a bottom-emitting VCSEL structure.

FIG. 4 illustrates an example of a VECSEL structure.

FIG. 5 illustrates an example of a LED structure.

FIG. 6 illustrates an example of a RC-LED structure.

FIG. 7 illustrates an example of an edge-emitting laser.

DETAILED DESCRIPTION

The present disclosure describes VCSELs having low divergence and/or operable for high single-mode power in some cases. In particular, a hybrid mirror is provided by combining a narrow bandwidth mirror with a high-reflectivity mirror, such that the narrow bandwidth mirror is place within the laser cavity (i.e., between two high-reflectivity mirrors). Preferably, the narrow bandwidth mirror has a sufficiently large penetration depth to achieve the desired diffraction losses of higher order transverse modes, and has a narrow enough stop-band to filter out unwanted modes. The reflectivity of the high-reflectivity mirror should be insufficient by itself for the laser to achieve lasing. There should be an adequate phase matching layer between the two mirrors for constructive interference. The combined reflectivity at the designed wavelength (peak reflectivity) is sufficient for the laser to achieve lasing.

Figure 1:
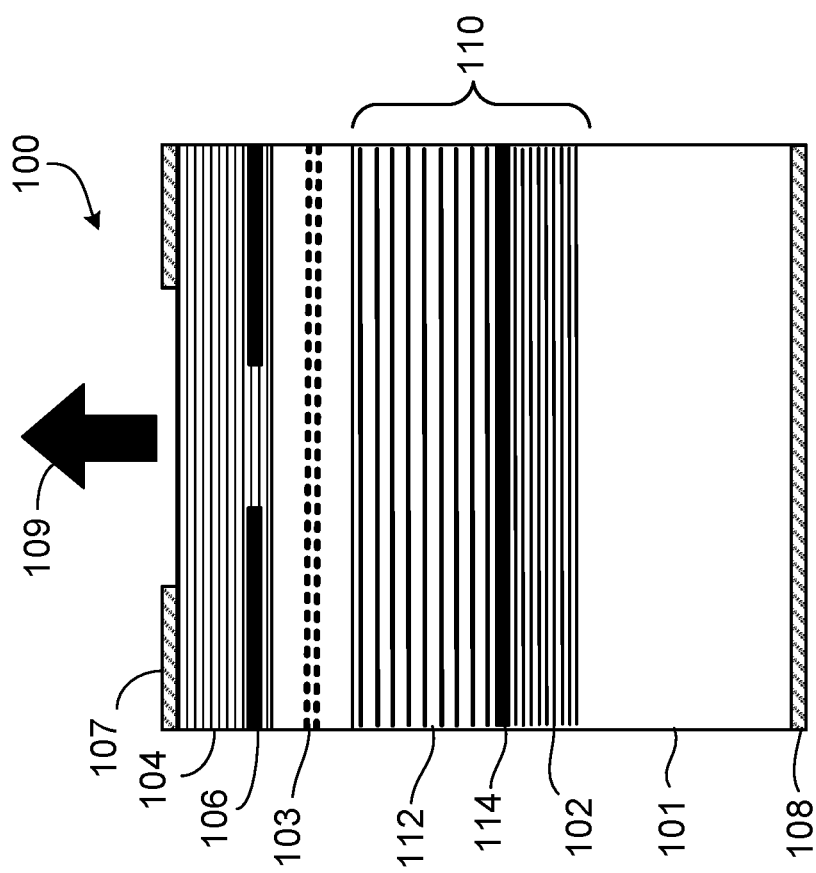
FIG. 1 illustrates an example of a top-emitting VCSEL structure.

As shown in FIG. 1, a top-emitting VCSEL device 100 includes a substrate 101 (e.g., a N—GaAs substrate) on which epitaxial layers for the VCSEL structure are grown, for example, by a metal-organic chemical vapor deposition (MOCVD) or other deposition process. The optical resonant laser cavity of the VCSEL is formed by a hybrid mirror 110 and a distributed Bragg grating (DBR) partial-reflectivity top mirror 104 to allow for emission of the VCSEL beam 109. The hybrid mirror 110 can be achieved by combining a narrow bandwidth mirror 112 (e.g., a low-contrast N-DBR) with a high-reflectivity (e.g., 100%) bottom mirror 102, such that the narrow bandwidth mirror 112 is placed within the laser cavity (i.e., between the two relatively high-reflectivity mirrors 102, 104). The bottom mirror 102 can be implemented, for example, as a high-contrast N-DBR. One or more phase-matching layers 114 can be provided between the bottom mirror 102 and the narrow bandwidth mirror 112. The top mirror 104 can be implemented, for example, as a high-contrast P-DBR.

A gain section 103, which may be referred to as an active section and can include quantum wells, is disposed between the hybrid reflector 110 and the top reflector 104. A current aperture 106 confines the current in the center region of the VCSEL device 100 to activate the quantum wells to produce optical gain and to generate a laser cavity mode in the VCSEL laser cavity. In the top-emitting VCSEL device illustrated in FIG. 1, the output beam 109 is taken out of the partial-reflectivity top mirror 104.

The VCSEL device 100 is activated by applying current through an anode and cathode electrical connections 107, 108, which can be implemented, for example, as metal contacts. The presence of the low-contrast DBR in the hybrid mirror 110 increases the effective length of the optical resonant cavity such that multiple longitudinal modes are present. Thus, the hybrid mirror 110 also may be referred to as an extended length mirror. Because of the effective narrower bandwidth of the hybrid mirror 110, the additional, unwanted longitudinal modes have much higher round-trip losses compared to the main mode and, thus, the longitudinal modes do not achieve lasing. Thus, the hybrid mirror 110 and the high reflection mirror 104 are operable to provide mode filtering by suppressing one or more longitudinal and/or transverse modes. Preferably, in some implementations, only one longitudinal mode lases.

Various details of the hybrid mirror 110 can vary depending on the implementation. Nevertheless, in a particular example, the hybrid mirror 110 can be composed of the following layers: a low-contrast N-DBR layer 112 having a thickness in a range of 4 µm-15 µm, and a refractive index difference Δn/n in the range of 1%-7%; a N-phase matching layer 114 having a quarter wavelength optical thickness, and an index of refraction n of about 3.5; and a high-contrast N-DBR mirror 102 having a thickness in a range of 2 µm-4 µm, and refractive index difference Δn/n in the range of 10%-20%. Some or all of the foregoing values may differ for other implementations.

In some instances, the extended length mirror has an effective penetration depth extending multiple emission wavelength distances from the first side of the extended length mirror. For example, the effective penetration depth of the extended length mirror extends, in some cases, between 46-116 emission wavelength distances. In some cases, the penetration depth of the extended length mirror is between 6-15 µm, the emission wavelength is between 700-1064 nm, and the relative refractive index difference is between 1-7%. In some instances, the penetration depth of the high reflection mirror is between 2-4 µm, the emission wavelength is between 700-1064 nm, and the relative refractive index difference is between 10-20%.

In some instances, the high reflection mirror has an effective penetration depth extending multiple emission wavelength distances from the first side of the high reflection mirror. In some cases, the effective penetration depth of the high reflection mirror extends between 15-30 emission wavelength distances In some implementations, the full-width half-maximum (FWHM) intensity divergence angle is less than 10 degrees.

Figure 2:
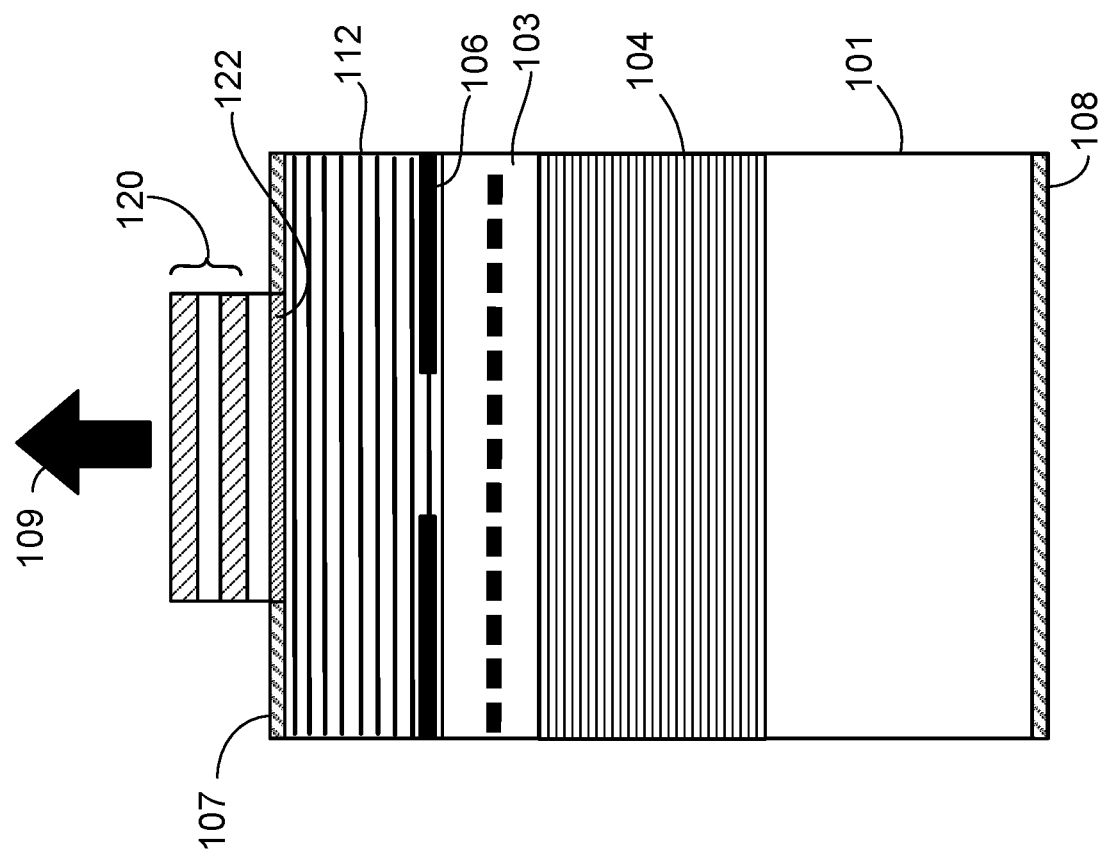
FIG. 2 illustrates another example of a top-emitting VCSEL structure.

Some implementations include additional features to enhance operation. For example, as shown in FIG. 2, the VCSEL device includes a high-contrast dielectric mirror coating 120 on top of a phase matching layer 122 and a low-contrast mirror 112.

A hybrid mirror as described above also can be integrated into a bottom-emitting VCSEL 200 as shown in the example of FIG. 3. The VCSEL device 200 includes a substrate 201 (e.g., a N—GaAs substrate) on which epitaxial layers for the VCSEL structure are grown. The optical resonant laser cavity of the VCSEL is formed by a hybrid mirror 210 and a distributed Bragg grating (DBR) high-reflectivity top mirror 104 (e.g., 100%). The hybrid mirror 110 can be achieved by combining a narrow bandwidth mirror 212 (e.g., a low-contrast N-DBR) with the partial-reflectivity bottom mirror 202, such that the narrow bandwidth mirror 212 is placed within the laser cavity (i.e., between the two relatively high-reflectivity mirrors 202, 204). The bottom mirror 202 in this case is partially reflecting so as to allow for emission of the VCSEL beam 109. The bottom mirror 202 can be implemented, for example, as a high-contrast N-DBR. One or more phase-matching layers 214 can be provided between the bottom mirror 202 and the narrow bandwidth mirror 212. The top mirror 204 can be implemented, for example, as a high-contrast P-DBR.

The gain section 203, which can include quantum wells, is disposed between the hybrid mirror 210 and the top mirror 204. A current aperture 206 confines the current in the center region of the VCSEL device 200 to activate the quantum wells to produce optical gain and to generate a laser cavity mode in the VCSEL laser cavity. The VCSEL device 200 is activated by applying current through an anode and cathode electrical connections 207, 208, which can be implemented, for example, as metal contacts. In the bottom-emitting VCSEL device illustrated in FIG. 3, the output beam 209 is taken out of the partial-reflectivity bottom mirror 202.

As with the top-emitting VCSEL, the bottom-emitting VCSEL 200 is operable to provide mode filtering by suppressing one or more longitudinal and/or transverse modes. Preferably, in some implementations, only one longitudinal mode lases.

A low-contrast mirror can be used with other device such as vertical external-cavity surface-emitting lasers (VECSELs) as well, light emitting diodes (LEDs) and RC-LEDs. FIGS. 4-6 illustrate examples.

As shown in the example of FIG. 4, a low-contrast mirror 212 is provided on the external mirror 220 of a VECSEL. The low-contrast mirror 212 can be implemented, for example, using a shallow contrast dielectric coating.

Similarly, FIG. 5 shows an example of a LED 500 that includes a low-contrast mirror 112, and FIG. 6 shows an example of a RC-LED 600 that includes a low-contrast mirror 212.

Although the foregoing examples illustrate incorporation of a low-contrast mirror 112 or 212 onto vertically emitting devices, the techniques also can be used in connection with edge-emitting devices (e.g., edge-emitting lasers). As illustrated in FIG. 7, a narrow beam divergence semiconductor optical edge-emitting laser 700 includes a hybrid mirror (e.g., a hybrid DBR) 702. The hybrid DBR has first and second sides, the edge-emitting laser 700 being disposed on the first side of the hybrid DBR 702. The hybrid DBR 702 includes a high-contrast region 704 and a low-contrast region 706. The high-contrast region 704 includes multiple high refractive index difference pairs of DBR materials of a second charge-carrier type, the high-contrast pairs being periodically disposed within the high-contrast region. The low-contrast region 706 includes multiple pairs of low refractive index difference DBR materials of the second charge-carrier type, the low-contrast pairs being periodically disposed within the low-contrast region. The hybrid DBR 702 can include one or more phase-matching layers 708 disposed between the high-contrast region 704 and the low-contrast region 706. The hybrid DBR also can include a backside dielectric coating disposed on the second side of the hybrid DBR. The hybrid DBR 702 and the edge-emitting laser 700 are operable in combination to generate a spectral bandwidth of emission 709, where one or more transverse and/or longitudinal modes are substantially suppressed such that the beam divergence and/or the spectral width of emission is substantially reduced.

The VCSELs and other light emitting devices described here can be used for applications such as compact, high-sensitivity LIDAR time-of-flight (TOF) systems and optical, high-bandwidth communications for high-speed data links. Examples of such applications include measuring short distances in self-driving automobiles and other proximity sensing applications. The devices also can be incorporated into three-dimensional sensing and gesture recognition, for example, in gaming and mobile devices. Further, in data-link applications, replacing low bandwidth data optoelectronics with higher bandwidth can enable existing fiber links to be upgraded at relatively low cost without the need to add fiber infrastructure.

Various modifications can be made to the foregoing examples. Further, various features may be omitted in some implementations, while other features may be added. Features described in connection with different embodiments may, in appropriate instances, be combined in a single implementation. Thus, other implementations are within the scope of the claims.

What is claimed is:

1. A narrow beam divergence semiconductor source operable to generate a beam having a substantially narrow beam divergence, an emission wavelength, and a substantially uniform beam intensity, the narrow beam divergence semiconductor source comprising:
   an optical resonant cavity including a high reflection mirror having first and second sides, an extended length mirror having first and second sides, and an active region;
   the high reflection mirror and the extended length mirror being disposed on distal sides of the active region such that the first side of the high reflection mirror is coupled to a first side of the active region and the first side of the extended length mirror is coupled to a second side of the active region opposing the first; and
   a plurality of electrical contacts operable to direct electric current to the active region;
   wherein the extended length mirror comprises a narrow bandwidth mirror and a high-reflectivity mirror and a hybrid DBR including a high-contrast region and a low-contrast region, wherein the high-contrast region includes a plurality of DBR pairs using materials with high refractive index difference, the DBR pairs being periodically disposed within the high-contrast region, and wherein the low-contrast region includes a plurality DBR pairs using materials with low-refractive index difference, the low-contrast pairs being periodically disposed within the low-contrast region.

2. The narrow beam divergence semiconductor source of claim 1, wherein the extended length mirror and the high reflection mirror are operable to suppress one or more longitudinal and/or transverse modes such that one or more longitudinal and/or transverse modes lase.

3. The narrow beam divergence semiconductor source of claim 2, wherein only one longitudinal mode lases.

4. The narrow beam divergence semiconductor source of claim 1, wherein the extended length mirror has:
   an effective penetration depth extending a plurality of emission wavelength distances from the first side of the extended length mirror; and
   a relative refractive index difference.

5. The narrow beam divergence semiconductor source of claim 4, wherein the high reflection mirror has:
   an effective penetration depth extending a plurality of emission wavelength distances from the first side of the high reflection mirror; and
   a relative refractive index difference.

6. The narrow beam divergence semiconductor source of claim 1, wherein the full width half maximum intensity divergence angle is less than 10 degrees.

7. The narrow beam divergence semiconductor source of claim 1, wherein the source is operable as either: a VCSEL; or an RC-LED; or an LED.

8. The narrow beam divergence semiconductor source of claim 1, wherein the high reflection mirror further includes a supplemental extended length mirror having a first side substantially coincident with the first side of the high reflection mirror, the supplemental extended length mirror having an effective penetration depth, the effective penetration depth extending a plurality of emission wavelength distances from the first side of the supplemental extended length mirror, the supplemental extended length mirror being further having a relative refractive index difference.

9. The narrow beam divergence semiconductor source of claim 1, wherein the narrow bandwidth mirror and the high reflectivity mirror are arranged to reduce the wavelength linewidth of the reflection such that one or more longitudinal and/or transverse modes are suppressed and one or more longitudinal and/or transverse modes lase.

10. The narrow beam divergence semiconductor source of claim 1 further including an oxide aperture operable to increase the current density in the active region.

11. The narrow beam divergence semiconductor source of claim 1, further including an emission mirror and a backside mirror disposed on opposing sides of the narrow beam divergence semiconductor source, the backside mirror having higher reflectivity than the emission mirror.

12. The narrow beam divergence semiconductor source of claim 11, wherein either:
   the backside mirror includes the extended length mirror and the emission mirror includes the high reflection mirror; or
   the backside mirror includes the high reflection mirror, and the emission mirror includes the extended length mirror.

13. The narrow beam divergence semiconductor source of claim 1, wherein the DBR and/or the hybrid DBR are operable, together with the plurality of electrical contacts, to direct electric current to the active region.

14. The narrow beam divergence semiconductor source of claim 1, further comprising one or more phase-matching layers between the high-contrast region and the low-contrast region.

15. The narrow beam divergence semiconductor source of claim 1, wherein a first charge-carrier type is p-type semiconductor, and a second charge-carrier type is n-type semiconductor.

16. The narrow beam divergence semiconductor source of claim 15, wherein the high-contrast region of the hybrid DBR and the low-contrast region of the hybrid DBR are interposed by a substrate of the second charge-carrier type.

17. A narrow beam divergence semiconductor optical edge-emitting laser comprising:
   a hybrid distributed Bragg reflector (hybrid DBR), the hybrid DBR having first
   and second sides, the edge-emitting laser being disposed on the first side of the hybrid DBR;
   the hybrid DBR including a high-contrast region and a low-contrast region,
   wherein the high-contrast region includes a plurality of high refractive index difference pairs of a DBR materials of a second charge-carrier type, the high-contrast pairs being periodically disposed within the high-contrast region, and wherein the low-contrast region includes a plurality of pairs of a low refractive index difference DBR materials of the second charge-carrier type, the low-contrast pairs being periodically disposed within the low-contrast region; and
   the hybrid DBR and the edge-emitting laser being operable to generate an emission having a spectral width of emission and a beam divergence; wherein the edge-emitting laser and the hybrid DBR have a narrow spectral bandwidth and are operable to substantially suppress one or more transverse and/or longitudinal modes such that the beam divergence and/or the spectral width of emission is substantially reduce.

18. The narrow beam divergence semiconductor optical edge-emitting laser of claim 17, wherein the hybrid DBR further includes a phase-matching layer disposed between the high-contrast region and the low-contrast region.

19. The narrow beam divergence semiconductor optical edge-emitting laser of claim 17, wherein the hybrid DBR further includes a backside dielectric coating disposed on the second side of the hybrid DBR.

* * * * *